(12) United States Patent
Kim et al.

(10) Patent No.: US 11,946,809 B2
(45) Date of Patent: Apr. 2, 2024

(54) POLARIZATION MEASURING DEVICE AND METHOD OF FABRICATING SEMICONDUCTOR DEVICE USING THE SAME

(71) Applicant: SAMSUNG ELECTRONICS CO., LTD., Suwon-si (KR)

(72) Inventors: Ingi Kim, Seoul (KR); Minhwan Seo, Hwaseong-si (KR); Sangwoo Bae, Seoul (KR); Akinori Okubo, Hwaseong-si (KR); Jungchul Lee, Hwaseong-si (KR); Eunhee Jeang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/740,529

(22) Filed: May 10, 2022

(65) Prior Publication Data

US 2023/0068376 A1    Mar. 2, 2023

(30) Foreign Application Priority Data

Aug. 25, 2021    (KR) .................. 10-2021-0112471

(51) Int. Cl.
*G01J 4/02* (2006.01)
*G01J 4/04* (2006.01)

(52) U.S. Cl.
CPC .. *G01J 4/02* (2013.01); *G01J 4/04* (2013.01)

(58) Field of Classification Search
CPC ...... G01J 4/04; G01J 4/00; G01J 3/447; G01J 3/0224; G01J 1/0295; G01J 1/0425; G01J 1/0429; G01J 1/4228; G01J 1/4257; G01J 2004/004; G01J 3/2803; G01J 3/433; G01J 3/453; G01J 3/0208; G01J 3/0237; G01J 1/44; G01J 11/00; G01J 2009/0276; G01J 3/0286; G01J 3/2823; G01J 2003/1291; G01J 3/42; G01J 2001/4242; G01J 3/0205; G01J 3/12; G01J 3/1838; G01J 1/46;

(Continued)

(56) References Cited

U.S. PATENT DOCUMENTS 4,353,650 A * 10/1982 Sommargren ..... G01B 9/02003
356/600
4,456,339 A *  6/1984 Sommargren ............ G01J 9/04
359/490.02

(Continued)

FOREIGN PATENT DOCUMENTS

JP    5-5656 A    1/1993
JP    3331624 B2    7/2002

(Continued)

*Primary Examiner* — Michael P Stafira
(74) *Attorney, Agent, or Firm* — Sughrue Mion, PLLC

(57) ABSTRACT

Provided is a polarization measuring device including a stage on which a measurement target is provided, a light source assembly configured to emit incident light, a first polarimeter configured to polarize the incident light, a second polarimeter configured to polarize reflected light reflected from the measurement target that is irradiated by the incident light, a filter assembly configured to remove noise from the reflected light, and a detector configured to receive the reflected light and measure an intensity of the reflected light and a phase of the reflected light.

19 Claims, 9 Drawing Sheets

(58) Field of Classification Search
CPC .... G01J 2004/001; G01J 3/021; G01J 3/0294;
G01J 3/108; G01J 3/1256; G01J 3/2889;
G01J 3/457; G01J 1/0414; G01J
2001/446; G01J 2003/104; G01J
2003/106; G01J 3/36; G01J 4/02; G01J
2003/425; G01J 2003/4275; G01J
2004/002; G01J 2004/005; G01J
2009/0253; G01J 2009/0261; G01J 3/02;
G01J 3/0218; G01J 3/0229; G01J 3/0264;
G01J 3/0289; G01J 3/10; G01J 3/28;
G01J 3/427; G01J 3/44; G01J 3/4406;
G01J 3/4412; G01J 3/443; G01J 9/0246;
G01J 9/0215; G01J 3/18; G01J 3/0256;
G01J 3/45; G01J 1/0228; G01J 1/429;
G01J 2001/4247; G01J 2003/1866; G01J
2003/1885; G01J 3/4537; G01J 9/02;
G01J 2003/1269; G01J 2003/2806; G01J
3/0272; G01J 3/06; G01J 3/4531; G01J
1/00; G01J 2003/1286; G01J 2003/2813;
G01J 2005/0077; G01J 2009/0265; G01J
3/027; G01J 3/26; G01J 3/30; G01J
3/4338; G01J 3/4532; G01J 5/0803; G01J
5/0806; G01J 5/0815; G01J 5/20; G01J
9/00

See application file for complete search history.

(56) References Cited

U.S. PATENT DOCUMENTS

| | | | | |
|---|---|---|---|---|
| 6,473,179 | B1 | 10/2002 | Wang et al. | |
| 6,970,241 | B1 * | 11/2005 | DeSa | G01N 21/6445 356/364 |
| 7,061,613 | B1 * | 6/2006 | Huang | G01N 21/211 356/364 |
| 7,064,828 | B1 * | 6/2006 | Rovira | G01N 21/211 356/369 |
| 7,369,234 | B2 | 5/2008 | Beaglehole | |
| 7,379,183 | B2 | 5/2008 | Mieher et al. | |
| 8,257,546 | B2 | 9/2012 | Davis et al. | |
| 9,651,426 | B2 * | 5/2017 | Kleczewski | G02F 1/0136 |
| 10,032,681 | B2 | 7/2018 | Bailey, III et al. | |
| 10,438,825 | B2 | 10/2019 | Jain et al. | |
| 2003/0179375 | A1 * | 9/2003 | Wang | G01N 21/23 356/364 |
| 2007/0030551 | A1 * | 2/2007 | Oka | G01J 4/04 359/239 |
| 2015/0285743 | A1 * | 10/2015 | Tung | G01N 21/21 356/369 |
| 2017/0003170 | A1 * | 1/2017 | Kleczewski | H01S 5/0071 |
| 2018/0157180 | A1 * | 6/2018 | Pandey | G03F 7/70633 |
| 2020/0116626 | A1 * | 4/2020 | Hovorka | G01N 21/211 |

FOREIGN PATENT DOCUMENTS

| | | | |
|---|---|---|---|
| JP | 2002543381 A * | 12/2002 | |
| JP | 2002544501 A * | 12/2002 | |
| JP | 2009-85887 A | 4/2009 | |
| KR | 10-0247918 B1 | 3/2000 | |
| KR | 20170092803 A * | 8/2017 | |
| WO | WO-2015198061 A1 * | 12/2015 | ............... G01J 4/04 |

* cited by examiner

POLARIZATION MEASURING DEVICE AND METHOD OF FABRICATING SEMICONDUCTOR DEVICE USING THE SAME

CROSS-REFERENCE TO RELATED APPLICATION

This application is based on and claims priority under 35 U.S.C. § 119 to Korean Patent Application No. 10-2021-0112471, filed on Aug. 25, 2021, in the Korean Intellectual Property Office, the disclosure of which is incorporated by reference herein in its entirety.

BACKGROUND

Example embodiments of the present disclosure relate to a polarization measuring device and a method of fabricating a semiconductor device using the polarization measuring device, and more particularly, to a polarization measuring device using reflectivity and a method of fabricating a semiconductor device using the polarization measuring device.

As semiconductor technologies develop, the size of a semiconductor device has been reduced and the performance of a semiconductor device has been gradually improved. For example, a multi-bridge channel field effect transistor (MBCFET) has improved performance of semiconductor devices by increasing a contact area between a gate and a channel. When an MBCFET is formed, a plurality of thin film layers may be etched on a wafer to form a source and a drain.

SUMMARY

One or more example embodiments provide a polarization measuring device which facilitates quick and accurate measurement of a measurement target and a method of fabricating a semiconductor device using the polarization measuring device.

According to an aspect of an example embodiment, there is provided a polarization measuring device including a stage on which a measurement target is provided, a light source assembly configured to emit incident light, a first polarimeter configured to polarize the incident light, a second polarimeter configured to polarize reflected light reflected from the measurement target that is irradiated by the incident light, a filter assembly configured to remove noise from the reflected light, and a detector configured to receive the reflected light and measure an intensity of the reflected light and a phase of the reflected light.

According to another aspect of an example embodiment, there is provided A polarization measuring device including a stage on which a measurement target is provided, a light source assembly configured to emit incident light, a first polarimeter configured to polarize the incident light, a second polarimeter configured to polarize reflected light reflected from the measurement target that is irradiated by the incident light, a filter assembly configured to remove noise from the reflected light, and a detector configured to receive the reflected light and measure an intensity of the reflected light and a phase of the reflected light, wherein the first polarimeter includes a photoelastic modulator configured to change a phase of the incident light, and wherein the filter assembly includes a lock-in amplifier configured to selectively acquire a signal of reflected light of a certain frequency.

According to another aspect of an example embodiment, there is provided a method of fabricating a semiconductor device, the method including generating reflected light by reflecting light from a measurement target that is irradiated by linearly polarized incident light, filtering the reflected light, and detecting the reflected light by receiving the reflected light, wherein the incident light includes first incident light and second incident light, a phase of the first incident light being different from a phase of the second incident light, wherein the filtering of the reflected light includes selectively filtering a signal of a modulation frequency f of a photoelastic modulator and a signal of a frequency 2f, which is twice the modulation frequency f of the photoelastic modulator, and wherein the detecting of the reflected light includes receiving reflectivity information of the reflected light.

BRIEF DESCRIPTION OF THE DRAWINGS

Example embodiments will be more clearly understood from the following detailed description taken in conjunction with the accompanying drawings in which.

DETAILED DESCRIPTION OF THE EMBODIMENTS

Figure 1:
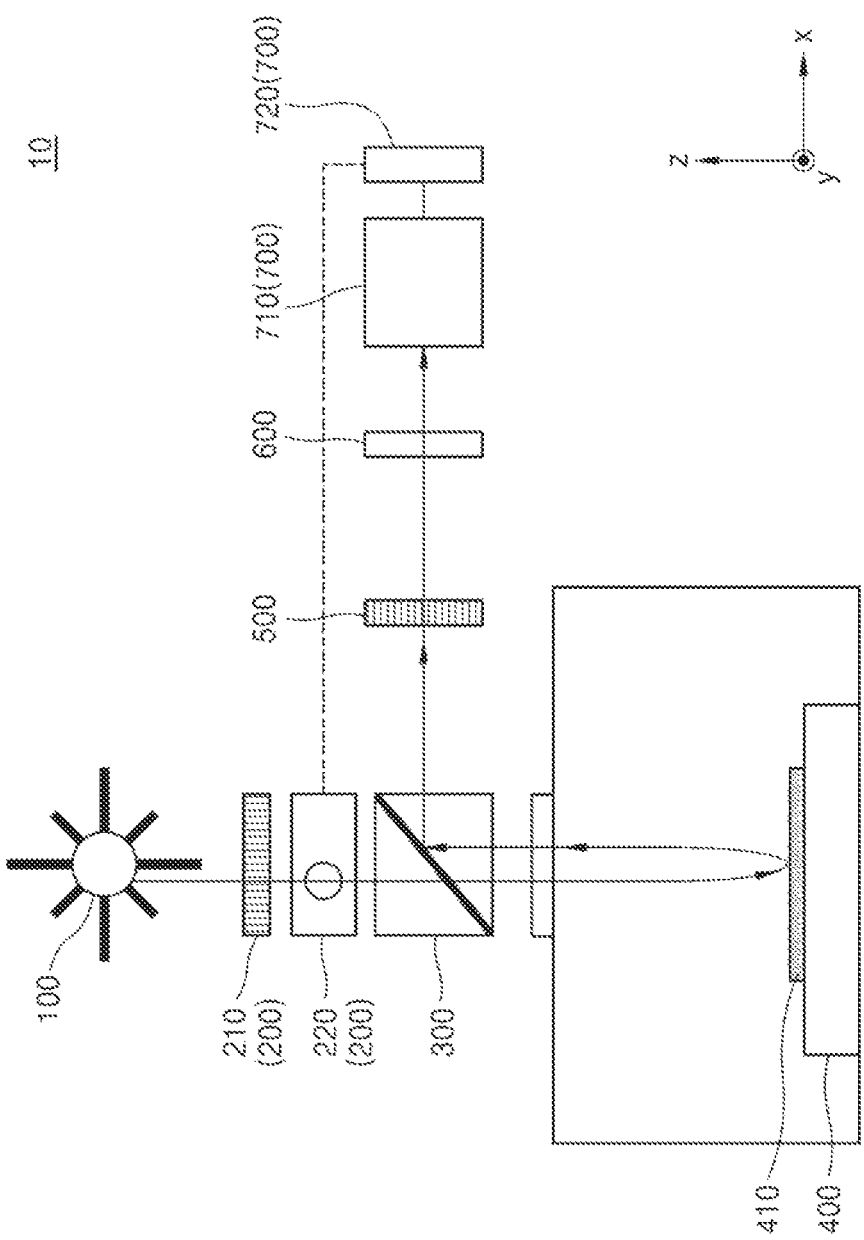
FIG. 1 is a structural diagram schematically illustrating a polarization measuring device according to an example embodiment.

Hereinafter, example embodiments will be described in detail with reference to the accompanying drawings. Like reference numerals in the drawings denote like elements, and any redundant description will be omitted.

FIG. 1 is a structural diagram schematically illustrating a polarization measuring device 10 according to an example embodiment.

With reference to FIG. 1, the polarization measuring device 10 according to an example embodiment may include a light source unit (light source assembly) 100, a first polarimeter 200, a beam splitter 300, a stage 400, a second polarimeter 500, a filter unit (filter assembly) 600 and/or a detection unit (detector) 700.

The polarization measuring device 10 may measure a reflectivity and a phase of polarized light of reflected light to identify a progression degree of a progress of a measurement target 410.

For example, the polarization measuring device 10 may perform an after development inspection (ADI). In another example, the polarization measuring device 10 may perform an after etching inspection. In another example, the polarization measuring device 10 may perform an after cleaning inspection (ACI) according to an etching process.

The light source unit 100 may emit incident light for an optical and non-destructive inspection of the measurement target 410. According to some example embodiments, the light source unit 100 may be a system including a plurality of optical elements, such as a collimator, a polarizer, a condensing lens, etc., but embodiments are not limited thereto.

The light source unit 100 may generate light of a required wavelength and input the generated light to the first polarimeter 200. The light source unit 100 may generate and output incident light of multi-wavelength and/or short wavelength. For example, the light source unit 100 may generate and output coherent light. The coherent light may refer to light that causes interference such as a constructive interference or destructive interference by a phase difference when two or more pieces of light overlap. For example, the light source unit 100 may include a light source and a monochromator. The light source may generate and output broadband light. The monochromator may convert the broadband light into monochromatic light to be output by the light source unit 100. The light source unit 100 may operate by converting broadband light from the light source into monochromatic light to be output. According to an example embodiment, the light source unit 100 may be implemented including a plurality of point sources outputting monochromatic light.

The light source unit 100 may emit light of a non-continuous spectrum such as a sodium lamp, a mercury lamp, etc. According to some example embodiments, the light source unit 100 may be a laser that generates and outputs laser light. According to some example embodiments, the light source unit 100 may be any one of a gas laser such as a helium-neon laser, an xenon laser, a carbon dioxide laser, etc., a solid-state laser such as a gas laser, a ruby crystal laser, a yttrium aluminum garnet (YAG) laser, etc., and a semiconductor laser such as a gallium arsenide (GaAs) laser, an indium phosphide (InP) laser, etc.

The light source unit 100 may generate and emit light having a wavelength of about 100 nm to about 1000 nm. For example, the light source unit 100 may generate and emit light having a wavelength of about 200 nm to about 800 nm.

According to an example embodiment, when the incident light includes only light of short wavelengths, to prevent the intensity of the incident light from being decreased by the polarimeter, the light source unit 100 may include a half-wave plate. The half-wave plate may change a polarization direction of linearly polarized incident light to any angle depending on a rotation angle of the half-wave plate, and may not change a polarization direction of circularly polarized incident light.

The first polarimeter 200 may radiate the incident light to the measurement target 410 using a plurality of optical elements. In the polarization measuring device 10 of the example embodiment, the first polarimeter 200 may include, for example, a polarizer 210 and a photoelastic modulator 220. The polarizer 210 may polarize incident light generated in the light source unit 100 to be output. The polarization may be, for example, linear polarization. The linear polarization may refer to conversion into linearly polarized light by passing only P polarization components (or horizontal components) or S polarization components (or vertical components) of incident light. In another example embodiment, the polarizer 210 may circularly polarize or elliptically polarize the incident light.

For example, the polarizer 210 may linearly polarize the incident light from the x axis to they axis by about ±45°. According to the physical and/or chemical properties of the measurement target 410, a polarization angle generated by the polarizer 210 may change.

For example, the incident light may be linearly polarized. According to some example embodiments, the incident light may be polarized to include each of an S polarization component and a P polarization component. According to some example embodiments, a polarization axis of the incident light may be polarized by about 45° with respect to an incident plane, but embodiments are not limited thereto. For example, the incident light may be polarized by any angle, and may be P-polarized light or S-polarized light.

First reference light and second reference light may be light polarized and separated by the polarizer 210, and the first reference light and the second reference light may respectively include different polarization components. According to some example embodiments, a polarization axis of the first reference light and a polarization axis of the second reference light may be perpendicular to each other. For example, the first reference light may include only the P polarization components, and the second reference light may include only the S polarization components, but embodiments are not limited thereto. The first reference light and the second reference light may be polarized by any angles that are orthogonal to each other.

The polarizer 210 may include, for example, a wire-grid polarizer and/or a Glan prism.

The incident light polarized through the polarizer 210 may be incident on the photoelastic modulator 220. According to an example embodiment, the photoelastic modulator 220 may change a phase of polarized incident light.

The photoelastic modulator 220 may include crystal quartz. The photoelastic modulator 220 may vibrate the crystal quartz to polarize incident light. A phase of the incident light, which has passed through the photoelastic modulator 220, may be delayed. According to a vibration amplitude of crystal quartz, a degree of phase delay of the incident light may be changed. When the vibration amplitude of crystal quartz increases, the degree of phase delay of the incident light may increase.

When light is incident on a medium having optical anisotropy, the light may be divided into two pieces of light having different polarizations and phases. This phenomenon is referred to as double refraction. The photoelastic modulator 220 may delay a phase of incident light by using the principle of double refraction. The light, which has passed through the photoelastic modulator 220, may be divaricated into an extraordinary wave (e-wave) and an ordinary wave (o-wave), and a phase of the e-wave and a phase of the o-wave may be different from each other.

The difference between the phase of the e-wave and the phase of the o-wave may be referred to as a phase difference which may be a phase difference between light projecting a fast axis of the photoelastic modulator 220 and light projecting a slow axis of the photoelastic modulator 220.

A vibration frequency of crystal quartz may be the modulation frequency f of the photoelastic modulator 220. The range of the modulation frequency f of the photoelastic modulator 220 may be about 40 kHz to about 60 kHz.

The incident light, which has passed through the photoelastic modulator 220, may be incident on the measurement target 410 after passing through the beam splitter 300. An incident angle of the incident light toward the measurement target 410 may vary widely. For example, the range of an incident angle of the incident light toward the measurement target 410 may be about 0° to about 75°. According to an example embodiment, the incident angle of the incident light toward the measurement target 410 may be about 0°. For example, the incident light may be incident vertically on the measurement target 410. When the incident angle of the incident light toward the measurement target 410 is about 0°, the polarization measuring device 10 may more easily control the incident light and the reflected light.

The beam splitter 300 may be configured to selectively change a path of the reflected light without changing a path of the incident light.

The stage 400 may support and fix the measurement target 410. For example, the measurement target 410 may be arranged on an upper surface of the stage 400, and the stage 400 may support and fix a lower surface of the measurement target 410. The stage 400 may be a three-dimensional movable stage which may be moved three-dimensionally. As the stage 400 moves, the measurement target 410 may also move along with the stage 400. For example, through the movement of the stage 400, a focusing on the z axis and/or movement on the x-y plane, etc. of the measurement target 410 may be performed. Here, the z axis may correspond to a normal perpendicular to the upper surface of the stage 400 or the measurement target 410, and the x-y plane may correspond the upper surface of the stage 400 or the measurement target 410, or a plane perpendicular to the z axis. The stage 400 may rotate the measurement target 410 with respect to an axis passing the center of the measurement target 410, of the normal of the upper surface of the measurement target 410. The stage 400 may include, for example, a chuck such as a vacuum chuck, an electrostatic chuck, etc. According to an example embodiment, the measurement target 410 and the stage 400 may be arranged inside a chamber.

In addition, the measurement target 410 may be, for example, a mask including patterns, a wafer, and/or silicon (Si), etc. Further, the measurement target 410 may be a semiconductor device including a multi-pattern layer, an overlay mark, etc.

The wafer may include a semiconductor element such as germanium (Ge) or a compound semiconductor such as silicon carbide (SiC), gallium arsenide (GaAs), indium arsenide (InAs), and indium phosphide (InP). According to some example embodiments, the wafer may have a silicon on insulator (SOI) structure. The wafer may include a buried oxide layer. According to some example embodiments, the wafer may include a conductive area, for example, a well doped with impurities. According to some example embodiments, the wafer may have various element isolation structures, such as a shallow trench isolation (STI) for separating the doped wells. A plurality of material layers may be formed on the wafer, and a photoresist may be further provided on the plurality of material layers.

The wafer may be for manufacturing any one of a memory device and a non-memory device. According to some example embodiments, the memory device may be non-volatile NAND-type flash memory. According to some example embodiments, the memory device may include phase change random access memory (PRAM), magnetic random access memory (MRAM), resistance random access memory (ReRAM), ferroelectrics random access memory (FRAM), NOR flash memory, etc. Further, the memory device may be a volatile memory device which loses data when the power is down, such as dynamic random access memory (DRAM), static random access memory (SRAM), etc. According to some embodiments, the memory device may be a logic chip, a measuring device, a communication device, a digital signal processor (DSP), a System-On-Chip (SoC), etc.

According to an example embodiment, the measurement target 410 may have a multilayer structure. A multilayer thin film may be a structure in which two different materials are sequentially stacked. For example, when forming a vertical NAND (VNAND), a silicon oxide/silicon nitride ($SiO_2$/SiN) multilayer thin film may be formed on a wafer. Further, when forming an MBCFET, a structure of Si/SiGe thin film layers may be formed on a wafer. For example, when partially etching a plurality of Si/SiGe thin film layers, a polarization analyzer may measure an etch depth of the plurality of Si/SiGe thin film layers. However, embodiments are not limited thereto, and the polarization measuring device 10 may measure various types of measurement targets 410.

The polarization measuring device 10 according to an example embodiment may measure and analyze various properties of the measurement target 410. For example, light polarized through the first polarimeter 200 may be reflected from the measurement target 410, and a polarization state may be changed according to a state of the measurement target 410. The polarization state may refer to intensity (reflectivity) information of reflected light.

Accordingly, the polarization measuring device 10 of the example embodiment may measure and analyze various properties of the measurement target 410, such as overlay errors, patterns sizes, pattern thicknesses, pattern uniformities, etc. by detecting light reflected from the measurement target 410 (reflected light) and the polarization state of the reflected light. Further, according to an example embodiment, the polarization measuring device 10 may detect defects of the measurement target 410, such as defective patterns, foreign substances, etc.

In addition, the measurement and analysis of the measurement target 410 may be performed by comparing reflectivity information of the reflected light obtained through the detection unit 700 to polarization phase information of the reflected light with reference information stored in a database. Further, according to an example embodiment, the measurement and analysis of the measurement target 410 may be performed through learning based on the reflectivity information of a plurality of measurement targets 410 obtained through the polarization measuring device 10.

The reflected light reflected from the measurement target 410 may be incident on the beam splitter 300. The beam splitter 300 may change a path of the reflected light toward the detection unit 700. The beam splitter 300 may be configured to make a portion of the reflected light be incident on the detection unit 700 and transmit the remaining portion of the reflected light.

The reflected light of which a path has been changed by the beam splitter 300 may be incident on the second polarimeter 500. The second polarimeter 500 may include an analyzer. The analyzer may render two pieces of polarized light separated through the polarizer 210 that have a common polarization component. For example, the analyzer may be a polarizer which passes only middle light between vertical polarized light and horizontal polarized light, for example, a 45° polarization component. Accordingly, the common polarization component of the vertical polarized light and the horizontal polarized light from the first polarimeter 200, which corresponds to the 45° polarization component, may pass through the analyzer.

Each of the first polarimeter 200 and the second polarimeter 500 may have a polarization axis. The first polarimeter 200 and the second polarimeter 500 may transmit light horizontal to the polarization axis, and block light perpendicular to the polarization axis. The polarization axis of the first polarimeter 200 and/or the polarization axis of the second polarimeter 500 may be changed according to the measurement target 410. For example, when measuring the etch depth (in z direction) of the measurement target 410, the incident light may form about ±45° with the polarization axis of the first polarimeter 200 and the polarization axis of the second polarimeter 500, respectively.

The reflected light, which has passed through the second polarimeter 500, may be incident on the filter unit 600. The filter unit 600 may selectively transmit only a wavelength of a certain frequency. For example, the filter unit 600 may include a band pass filter (BPF), a monochromator, and/or a spectrometer.

A transmission frequency of the filter unit 600 may be determined according to the measurement target 410. For example, when the polarization measuring device 10 is used to measure an etch depth of the plurality of Si/SiGe thin film layers on the wafer, the filter unit 600 may selectively transmit reflected light of about 350 nm to about 450 nm. The transmission frequency will be described in more detail with reference to FIGS. 5A to 5C.

The reflected light transmitted by the filter unit 600 may be incident on the detection unit 700. The detection unit 700 may include a first detector 710 and a second detector 720. The first detector 710 may selectively detect only reflected light of a particular modulation frequency through a photodiode. However, the first detector 710 is not limited to a photodiode. The first detector 710 may be used for identifying the intensity of the reflected light for the measurement target 410.

However, the first detector 710 is not limited to the aforementioned devices. For example, the first detector 710 may include a photodetector, a balanced photodetector, an avalanche photodetector, and/or a photomultiplier tube.

The second detector 720 may include a lock-in amplifier. The lock-in amplifier may selectively detect only reflected light having a particular modulation frequency from the reflected light. For example, the lock-in amplifier may selectively detect only reflected light having the modulation frequency f of the photoelastic modulator 220 and reflected light having a frequency that is twice the modulation frequency f of the photoelastic modulator 220.

The lock-in amplifier may compare a reference signal with the reflected light to selectively detect only the reflected light having the modulation frequency f of the photoelastic modulator 220 and the reflected light having a frequency that is twice the modulation frequency f of the photoelastic modulator 220. The reference signal may refer to a signal synchronized with the modulation frequency of the photoelastic modulator 220. The lock-in amplifier may remove noise having a particular modulation frequency, for example, frequencies different from the modulation frequency f of the photoelastic modulator 220 and a frequency 2f that is twice the modulation frequency f of the photoelastic modulator 220. In particular, the noise may be generated by plasma emission inside the chamber where the measurement target 410 is arranged.

The intensity of the reflected light received by the detection unit 700 may be represented by the following [Equation 1].

$$I(t)=I[I_0+I_s \sin \delta(t)+I_c \cos \delta(t)] \quad \text{[Equation 1]}$$

Here, I(t) represents the intensity of the reflected light received by the detection unit 700, and δ(t) represents the phase change caused by the photoelastic modulator 220. $I_0$, $I_s$ and $I_c$ may be determined by a polarization angle of the polarizer 210, a polarization angle of the photoelastic modulator 220, and a polarization angle of the analyzer, respectively.

For example, when the polarization angle of the polarizer 210 is 45°, the polarization angle of the photoelastic modulator 220 is 0°, and the polarization angle of the analyzer is −45°, $I_0$, $I_s$ and $I_c$ may be determined according to the following [Equation 2].

$$I_0=1 \quad I_s=-\sin 2\Psi \sin \Delta \quad I_c=-\sin 2\Psi \cos \Delta \quad \text{[Equation 2]}$$

Here, the psi (ψ) represents a ratio of amplitudes of coherent light, i.e., two pieces of interference light, and the delta (Δ) represents the phase difference between the two pieces of interference light.

Further, sin δ(t) and cos δ(t) may be defined by the following [Equation 3].

$$\sin \delta(t)=2J_1(A_m)\sin(1*2\pi ft)+2J_3(A_m)\sin(3*2\pi ft)+ \ldots$$
$$\cos \delta(t)=J_0(A_m)+2J_2(A_m)\cos(2*2\pi ft)+ \quad \text{[Equation 3]}$$

Here, $A_m$ represents a vibration amplitude of the photoelastic modulator 220, $J_n$ ($A_m$) represents an $n^{th}$ Bessel function for $A_m$, and f represents a modulation frequency of the photoelastic modulator 220. When sin δ(t) and cos δ(t) are defined as described above, a term having a frequency greater than or equal to 3f may have a small value, and thus may be negligible. Accordingly, it may be sufficient for the detection unit 700 to selectively detect only reflected light having the modulation frequency f of the photoelastic modulator 220 and reflected light having a frequency that is twice the modulation frequency f of the photoelastic modulator 220.

The lock-in amplifier may selectively detect reflected light having a particular modulation frequency and then amplify the particular modulation frequency, for example, the reflected light having the modulation frequency f of the photoelastic modulator 220 and the reflected light having a frequency 2f that is twice the modulation frequency f of the photoelastic modulator 220. When the reflected light is amplified, the analysis of the reflected light may be more easily performed.

However, the second detector 720 is not limited to the aforementioned device. For example, the second detector 720 may be a DSP configured to selectively acquire only a signal having a certain frequency.

As illustrated in the drawing, the photoelastic modulator 220 and the second detector 720 may transmit and receive information about the modulation frequency f of the photoelastic modulator 220.

For reference, the reflectivity information, which is information about polarization properties of light, may be generally expressed as psi and delta. The reflectivity information may also be expressed as alpha (α) and beta (β), which are called oval constants. The relationship among psi, delta, alpha, and beta may be represented by the following [Equation 4].

$$\tan \Psi=(1+\alpha/1-\alpha)^{0.5} \quad \cos \Delta=\beta/(1-\alpha)^{0.5} \quad \text{[Equation 4]}$$

Related measuring devices have used a method of making light be incident on the measurement target 410 and measuring a progression degree of a progress of the measurement target 410 through the intensity of light reflected from the measurement target 410. However, the related measuring devices cannot measure polarized light and phase information of reflected light, and thus cannot accurately measure the progression degree of the process of the measurement target 410. On the contrary, the polarization measuring device 10 according to an example embodiment may obtain reflectivity information by polarizing incident light and selectively detecting from the polarized incident light only reflected light having a certain modulation frequency to more precisely measure the progression degree of the process of the measurement target 410.

In particular, to maintain stable performance of the MBC-FEET, the etch depth of the plurality of thin film layers on the wafer needs to be controlled more precisely. Accordingly, the etch depth of the plurality of thin film layers on the wafer needs to be measured in real time.

Thus, the polarization measuring device 10 of the example embodiment may solve issues the related measuring devices may have.

Figure 2:
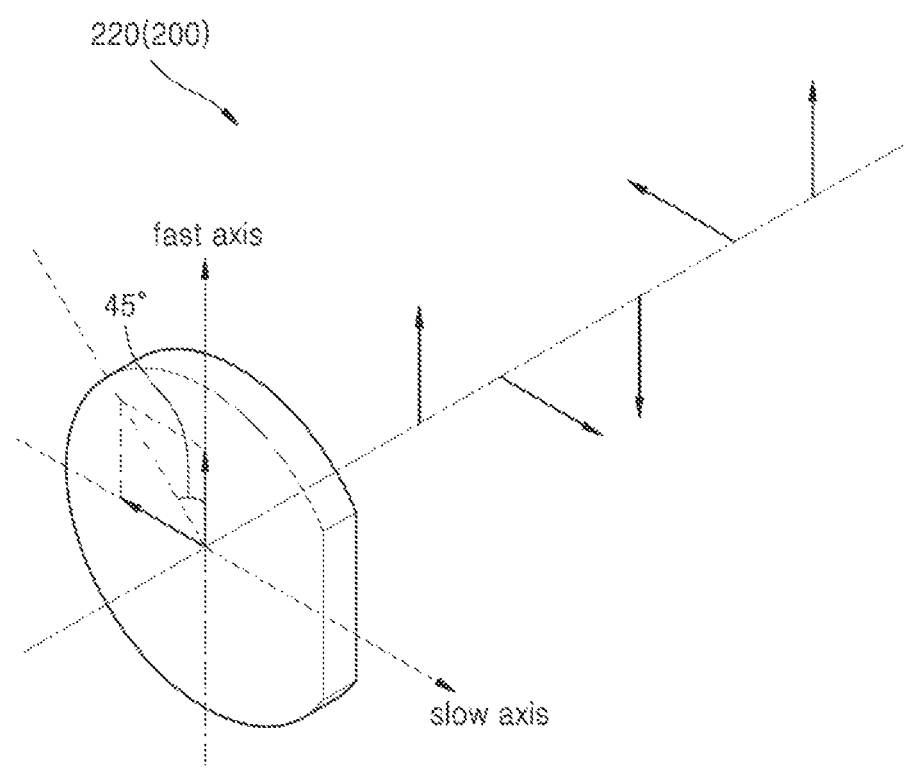
FIG. 2 is a conceptual diagram illustrating an operation of a photoelastic modulator according to an example embodiment.

FIG. 2 is a conceptual diagram illustrating an operation of the photoelastic modulator 220 according to an example embodiment.

With reference to FIG. 2, the photoelastic modulator 220 may change a phase of polarized light. Although FIG. 2 illustrates the case where linearly polarized light passes through the photoelastic modulator 220, circularly or elliptically polarized light may also pass through the photoelastic modulator 220, and its phase may be changed.

In FIG. 2, the linearly polarized light is described as forming 45° with the fast axis and the slow axis, respectively. The light, which has passed the fast axis, may have a more rapid phase than light, which has passed the slow axis. A phase difference may be the difference between a phase of the light, which has passed the fast axis, and a phase of the light, which has passed through the slow axis.

Accordingly, the polarization measuring device 10 may measure the phase difference of the reflected light, and identify physical properties of the measurement target 410, for example, the progression degree of the process of the measurement target 410.

Figure 3:
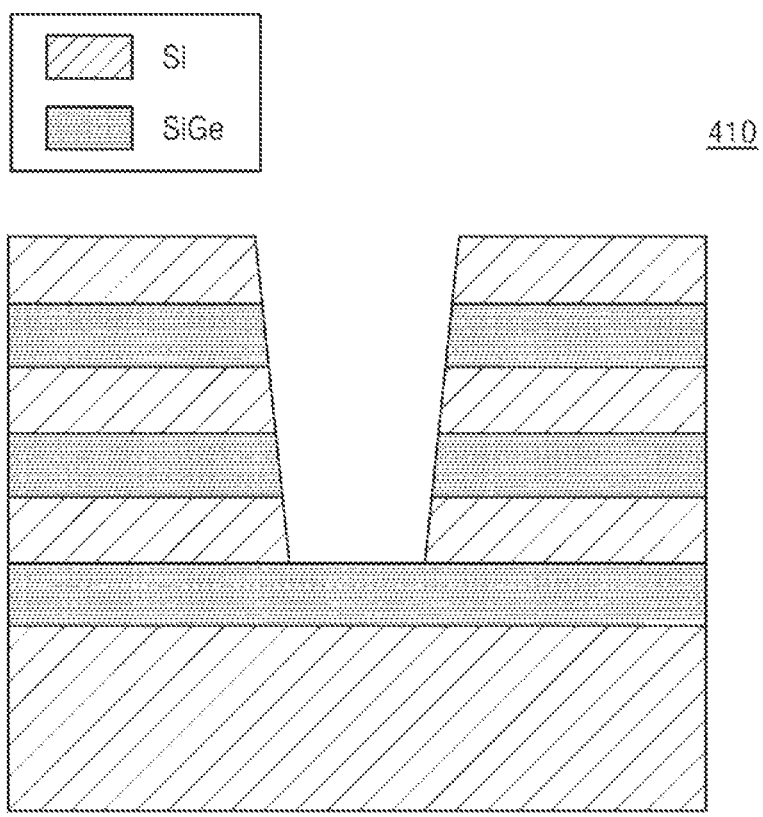
FIG. 3 is a diagram illustrating a measurement target in which a plurality of thin film layers are stacked according to an example embodiment.

FIG. 3 is a diagram illustrating the measurement target 410 in which a plurality of thin film layers are stacked according to an example embodiment.

With reference to FIG. 3, a plurality of Si/SiGe thin film layers may be formed on a wafer. Although FIG. 3 illustrates that three Si/SiGe thin film layers are formed, this is merely an example, and embodiments are not limited thereto. For example, two or less Si/SiGe thin film layers may be formed or four or more Si/SiGe thin film layers may be formed.

The plurality of thin film layers formed on the wafer may be partially etched. For example, when forming an MBCFET on a wafer, a source and a drain may be formed at a position where the plurality of thin film layers have been etched.

A process of etching Si/SiGe thin film layers may be a silicon recess (SR) process. According to an etch depth of the plurality of thin film layers, the precision of a semiconductor device may be determined.

The etching of the plurality of thin film layers may start at the uppermost layer. For convenience in explanation, the Si/SiGe thin film layers may be referred to as a $1^{st}$ Si/SiGe layer, a $2^{nd}$ Si/SiGe layer, and a $3^{rd}$ Si/SiGe layer from the bottom to the top.

For example, the SR process may be performed up to the $1^{st}$ Si layer. To control the SR process more precisely, the polarization measuring device 10 may calculate an etch depth of the plurality of thin film layers. According to an example embodiment, when the SR process is performed up to the 1st Si layer, the polarization measuring device 10 may identify such progress and control to carry out the following process.

FIG. 3 illustrates the case where the SR process is performed up to the $1^{st}$ Si layer.

As described above, the polarization measuring device 10 may measure the etch depth of the plurality of thin film layers by using the reflectivity information of the reflected light.

Figure 4A:
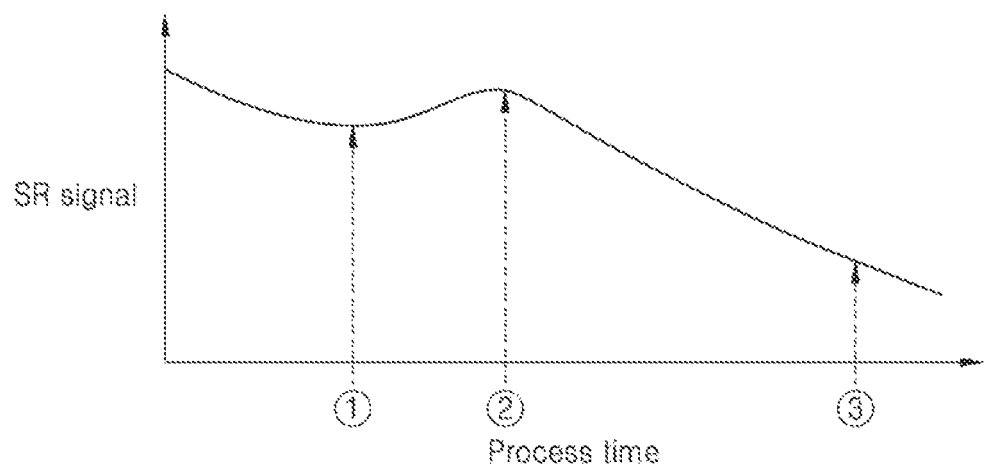
FIGS. 4A, 4B, and 4C are diagrams for explaining the effect of a polarization measurement device according to example embodiments.
Figure 4B:
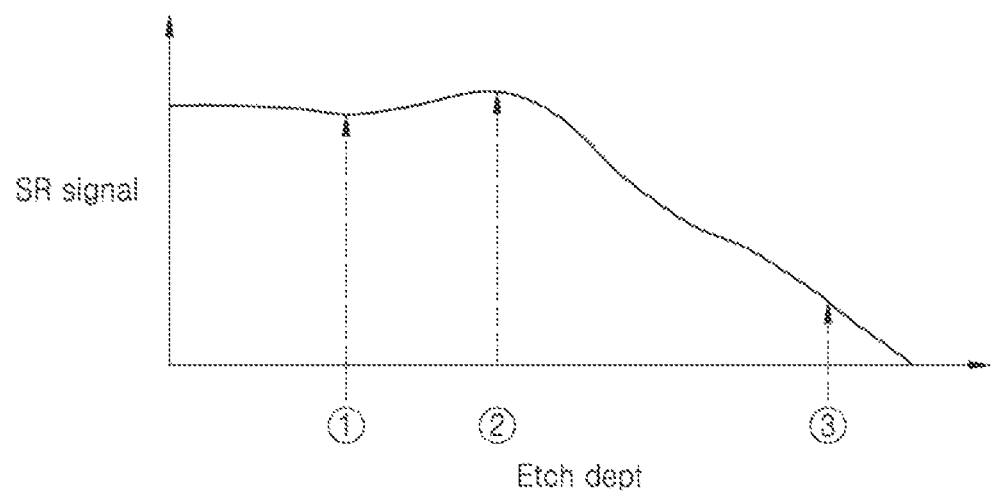
Figure 4C:
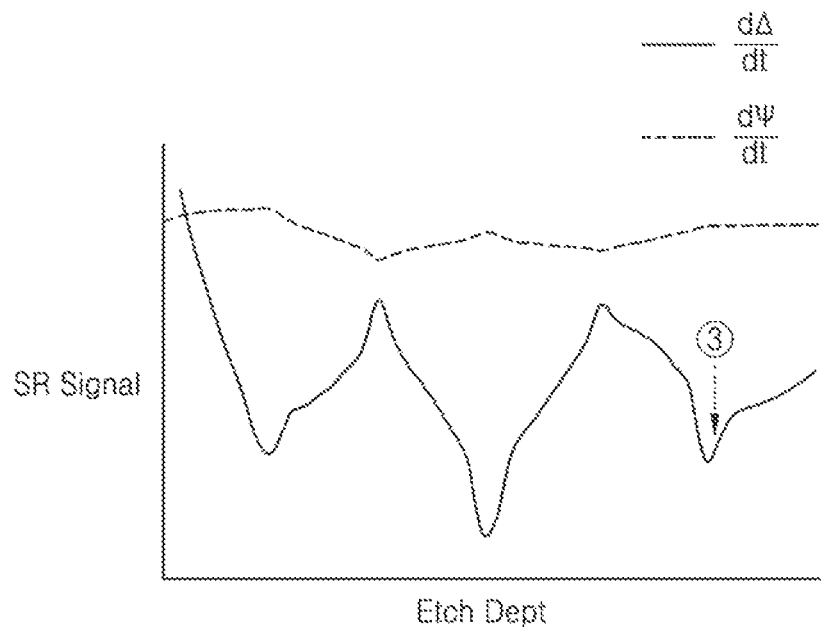

FIGS. 4A to 4C are diagrams for explaining the effect of the polarization measuring device 10 according to example embodiments.

More specifically, FIG. 4A is a graph showing intensities of a signal according to an SR depth when a related measuring device is used, and FIG. 4B is a graph showing intensities of a signal according to simulation of an SR depth when a related measuring device is used. FIG. 4C is a graph showing differential values of psi and delta in relation to time according to an SR depth when the polarization measuring device 10 according to an example embodiment is used.

With reference to FIGS. 3 to 4C, ①  to ③ may represent a certain time point of the process of etching the thin films of the plurality of layers through the SR process. For example, ① may indicate the time point when the etching of the $3^{rd}$ Si layer is started, ② may indicate the time point when the etching of the $3^{rd}$ SiGe layer is started, and ③ may indicate the time point when the etching of the Pt SiGe layer is started.

With reference to FIGS. 4A and 4B, when the plurality of thin films are etched through the SR process, it may be difficult for the related measuring device to identify the etch depth of the plurality of thin films. Particularly, it may be difficult to identify the etch depth between the $1^{st}$ Si layer and the Pt SiGe layer of the plurality of thin films. While at ① and ②, the slope of signal intensity changes to be easily identifiable, at ③, the slope of signal intensity does not change to be easily identifiable, and thus, the time point when the etching of the Pt SiGe layer is started may not be easily identified as well. In addition, at ① and ②, the slope of signal intensity does not change significantly, and may be difficult to determine each time point.

FIG. 4C is a graph showing differential values of psi and delta in relation to time according to the SR depth.

With reference to FIG. 4C, the related measuring device identifies the progression degree of the process based differential values of psi $$\left(\frac{d\Psi}{dt}\right)$$

in relation to time. For example, the differential values of psi in relation to time may be represented by the slope of the signal intensity shown in FIG. 4B. However, at ③, the differential values of psi in relation to time do not change significantly, and accordingly, the state of progress of the SR process may not be identified easily. As the polarization measuring device 10 measures both of differential values of psi in relation to time and differential values of delta in relation to time $\left(\dfrac{d\Delta}{dt}\right)$, the state of progress of the SR process may be precisely identified. At ③, the differential value of delta in relation to time may change greatly. Accordingly, the polarization measuring device 10 may perform the SR process more precisely.

In recent years, due to the high density integration of semiconductor devices, the demand for VNAND flash memory and MBCFET has increased. As a result, the repetitive stacking of a plurality of thin films on a wafer and an SR process are performed in an overlapping manner, and as the number of thin films increases, defining the borderline of the SR process may become more difficult. Accordingly, the related measuring devices indirectly identify the etch depth of the plurality of thin films based on etching time. The related measuring devices are not able to precisely measure the etch depth of the multilayer thin films, which leads to an increased frequency of etching defects.

Such etching defects may occur when the etch depth of the multilayer thin film for forming an actual semiconductor device, i.e., during the SR process, etc., is not precisely measured. The etching defects may cause errors such that a source/drain pattern is not formed afterwards. According to some example embodiments, the borderline of the SR process may be more clearly identified, and accordingly, errors in process due to the etching defects may be prevented or reduced. Accordingly, the reliability of manufacture of semiconductor devices may be improved.

Figure 5A:
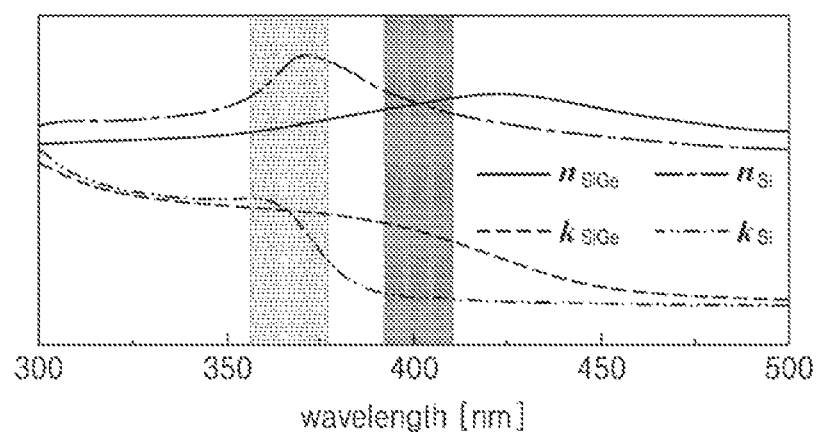
FIGS. 5A, 5B, and 5C are graphs showing refraction coefficients of silicon (Si) and silicon germanium (SiGe) according to a wavelength, an extinction coefficient, and sensitive areas of the coefficients according to a wavelength.
Figure 5B:
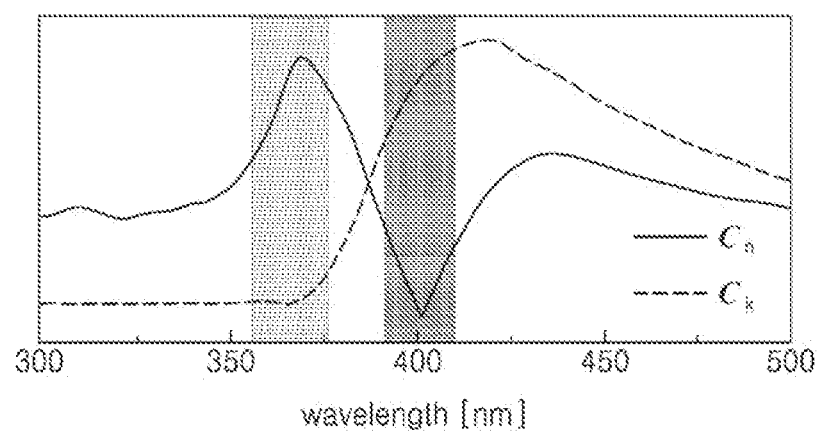
Figure 5C:
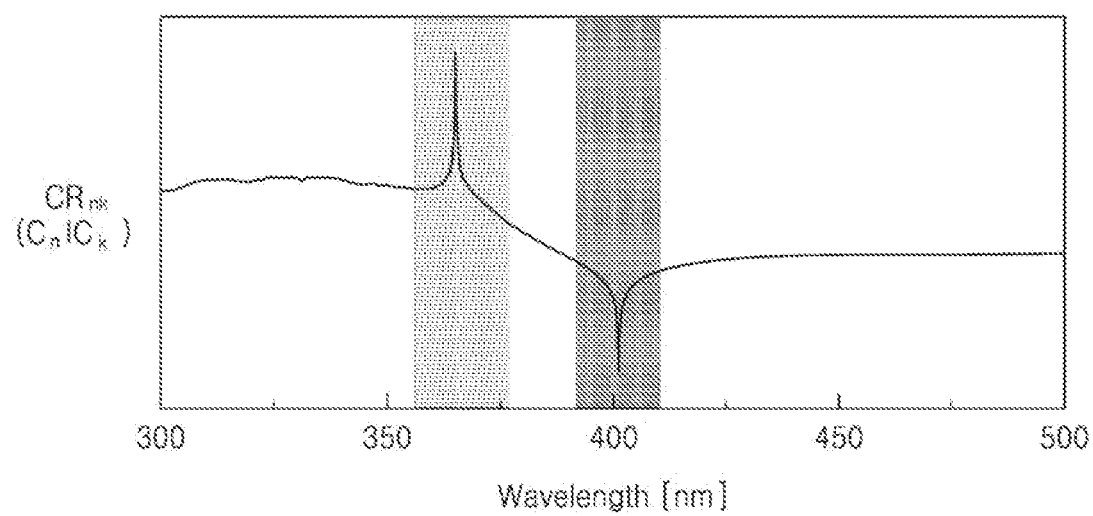

FIGS. 5A to 5C are graphs showing refraction coefficients of Si and SiGe according to a wavelength, extinction coefficient according to a wavelength, and sensitive areas of the coefficients according to a wavelength.

FIG. 5A shows refraction coefficients n and extinction coefficients k of Si and SiGe according to a wavelength. FIG. 5A illustrates the case where the measurement target 410 includes a plurality of Si/SiGe thin film layers.

With reference to FIG. 5A, near the wavelength band about 370 nm, the value of the extinction coefficient of SiGe and the value of the extinction coefficient of Si may be similar to each other. In addition, near the wavelength band of about 400 nm, the value of the refraction coefficient of SiGe and the value of the refraction coefficient of Si may be similar to each other. The extinction coefficient may be a constant indicating a degree of decrease in amount of a wave due to absorption when the wave passes a certain layer of a material.

FIG. 5B shows $C_n$ and $C_k$ according to a wavelength.

With reference to FIG. 5B, based on the refraction coefficient n and the extinction coefficient k, $C_n$ and $C_k$ may be defined as the following [Equation 5].

$$C_n = \dfrac{|n_{Si} - n_{SiGe}|}{n_{Si}} \quad \text{[Equation 5]}$$

$$C_k = \dfrac{|k_{Si} - k_{SiGe}|}{k_{Si}}$$

Here, $C_n$ may represent a ratio of the refraction coefficient of Si to the refraction coefficient of SiGe. Further, $C_k$ may represent a ratio of the extinction coefficient of Si to the extinction coefficient of SiGe. Near the wavelength band about 370 nm, $C_k$ may converge to 0, and $C_n$ may converge to a maximum value. Near the wavelength band about 400 nm, $C_n$ may converge to 0, and $C_k$ may converge to a maximum value.

FIG. 5C shows $CR_{nk}$ which represents a ratio between $C_k$ and $C_n$.

With reference to FIG. 5C, a wavelength band sensitive to a refractivity and a wavelength band sensitive to a phase difference may exist independently.

$CR_{nk}$ which represents a relative ratio between $C_n$ and $C_k$ may be defined as the following [Equation 6].

$$CR_{nk} = \dfrac{C_n}{C_k} \quad \text{[Equation 6]}$$

Near about 370 nm, $CR_{nk}$ may have a maximum value, and near about 400 nm, $CR_{nk}$ may have a minimum value. Accordingly, near about 370 nm where $CR_{nk}$ has a maximum value may be a wavelength band in which delta is sensitive, and near about 400 nm where $CR_{nk}$ has a minimum value may be a wavelength band in which psi is sensitive. Therefore, when the filter unit 600 selectively transmits reflected light near about 350 nm to about 450 nm, changes in reflectivity information of the reflected light may be effectively measured during the SR process.

As described above, the filter unit 600 may selectively transmit the wavelength within the aforementioned range through the BPF or the monochromator.

When the measurement target 410 is changed, the values of $C_n$, $C_k$ and $CR_{nk}$ may also change. For example, in III-V group semiconductor thin film layer structures, such as a plurality of indium gallium arsenide/indium phosphide (InGaAs/InP) structures, values of $C_n$, $C_k$ and $CR_{nk}$ may be obtained to calculate a wavelength band in which psi and delta are sensitive.

Figure 6:
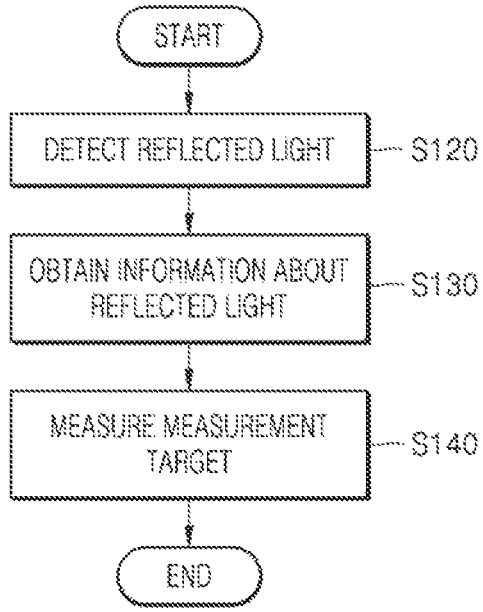
FIG. 6 is a flowchart illustrating a method of fabricating a semiconductor device using a polarization measuring device according to an example embodiment.

FIG. 6 is a flowchart illustrating a method of fabricating a semiconductor device using the polarization measuring device 10 according to an example embodiment. The example embodiments are described with reference to FIG. 1, and any redundant description is briefly given or omitted.

With reference to FIG. 6, a method of fabricating a semiconductor device, according to the example embodiment, may include detecting reflected light using the polarization measuring device 10 of FIG. 1 (S120). For example, by making polarized incident light be incident on the polarization measuring device 10, reflected light reflected from the measurement target 410 may be detected. The operation of detecting the reflected light (S120) is described in more detail with reference to FIG. 7.

Next, information of the reflected light may be obtained based on the reflected light (S130). For example, as for the information of the reflected light, as described above, the reflectivity information, for example, the psi and delta, may be calculated by calculating $C_n$, $C_k$ and $CR_{nk}$.

Then, based on the reflectivity information, the measurement target 410 may be measured (S140). Here, the measuring may include analyzing and identifying various properties of the measurement target 410. For example, based on the reflectivity information, various properties of the measurement target 410, such as overlay errors, pattern sizes, pattern thicknesses, pattern uniformities, etc. may be identified and analyzed.

Through the measurement method of the example embodiment, the reflectivity information of the reflected light may be more accurately obtained by detecting the reflected light at a surface of the measurement target 410.

Accordingly, a wavelength, which is sensitive to changes in etch depth, may be derived from calculating $C_n$, $C_k$ and $CR_{nk}$, and real time information regarding the reflectivity and phase difference may be obtained more effectively. Moreover, through the measurement method of the embodiment, the reflectivity information of the reflected light may be obtained periodically by using the photoelastic modulator 220, and the reflectivity information of the reflected light may be obtained in real time during the process. Therefore, the measurement target 410 may be measured very quickly and accurately.

Figure 7:
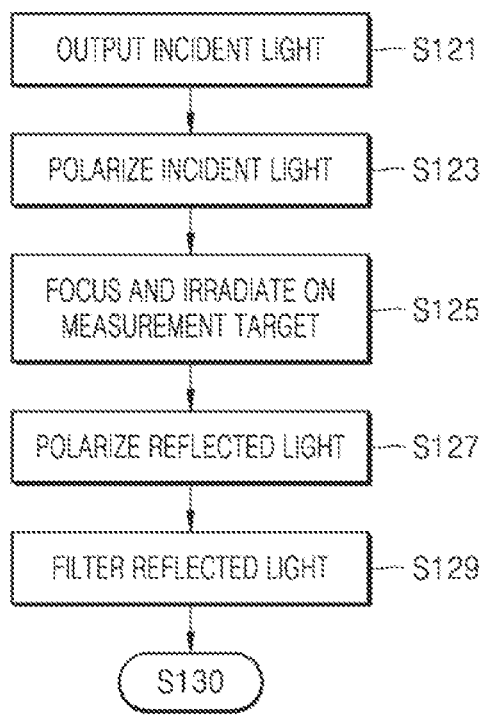
FIG. 7 is a flowchart illustrating an operation of detecting reflected light according to an example embodiment.

FIG. 7 is a flowchart illustrating the operation of detecting reflected light (S120) according to an example embodiment.

The example embodiments are described with reference to FIG. 1, and any redundant description is briefly given or omitted.

With reference to FIG. 7, in the measurement method of the example embodiment, the operation of detecting reflected light (S120) may include generating and outputting incident light at the light source unit 100 of the polarization measuring device 10 first (S121). The light source unit 100 may include, for example, a broadband light source and a monochromator. Accordingly, the broadband light source may generate broadband light, and the monochromator may convert the broadband light into required monochromatic light for output.

When the light source unit 100 outputs a short wavelength, the light source unit 100 may include a half-wave plate. The half-wave plate may change a polarization direction of linearly polarized incident light to any angle depending on a rotation angle of the half-wave plate, and may not change a polarization direction of circularly polarized incident light.

Next, the incident light may be polarized using the first polarimeter 200 (S123). The first polarimeter 200 may include the polarizer 210 and the photoelastic modulator 220. The polarization by the polarizer 210 may be, for example, linear polarization. However, the polarization by the polarizer 210 is not limited to linear polarization.

For example, the polarizer 210 may linearly polarize the incident light from the x axis to the y axis by about ±45°. According to the physical and/or chemical properties of the measurement target 410, a polarization angle may change. For example, the incident light may be linearly polarized. According to some example embodiments, the incident light may be polarized to include each the S polarization component and the P polarization component.

The photoelastic modulator 220 may delay a phase of polarized incident light. The range of the modulation frequency f of the photoelastic modulator 220 may be about 40 kHz to about 60 kHz.

The incident light, which has passed through the photoelastic modulator 220, may be focused and radiated on the measurement target 410 after passing through the beam splitter 300 (S125). An incident angle of incident light may vary widely. For example, a range of an incident angle may be about 0° to about 75°. According to an example embodiment, the incident angle may be set to about 0°. For example, the incident light may be incident vertically on the measurement target 410. When the incident angle is about 0°, the polarization measuring device 10 may more easily control the incident light and the reflected light.

The reflected light emitted by the beam splitter 300 may be incident on the second polarimeter 500. The second polarimeter 500 may include an analyzer. The analyzer may render two pieces of polarized light separated through a polarization prism that have a common polarization component. For example, the analyzer may be a polarizer which passes only middle light between vertical polarized light and horizontal polarized light, for example, a about 45° polarization component. Accordingly, the common polarization component of the vertical polarized light and the horizontal polarized light, which corresponds to the about 45° polarization component, may pass through the analyzer. Thus, the reflected light may be polarized through the analyzer (S127).

Then, the polarized reflected light may be incident on the filter unit 600. The filter unit 600 may selectively transmit only a wavelength of a certain frequency (S129).

A transmission frequency of the filter unit 600 may be determined according to the measurement target 410. For example, when the polarization measuring device 10 is used to measure an etch depth of the plurality of Si/SiGe thin film layers on the wafer, the filter unit 600 may selectively transmit reflected light having a wavelength of about 350 nm to about 450 nm.

The reflected light transmitted by the filter unit 600 may be incident on the detection unit 700. The detection unit 700 may include a first detector 710 and a second detector 720. The first detector 710 may selectively detect only reflected light of a certain modulation frequency. The first detector 710 may be used for identifying the intensity of the reflected light for the measurement target 410.

The second detector 720 may selectively detect only a wavelength having a particular frequency from the reflected light. For example, the second detector 720 may selectively detect only reflected light having the modulation frequency f of the photoelastic modulator 220 and reflected light having a frequency 2f that is twice the modulation frequency f of the photoelastic modulator 220.

By comparing a reference signal with the reflected light, the second detector 720 may selectively detect only reflected light having the modulation frequency f of the photoelastic modulator 220 and reflected light having a frequency 2f that is twice the modulation frequency f of the photoelastic modulator 220.

The second detector 720 may remove noise having a particular modulation frequency, for example, frequencies different from the modulation frequency f of the photoelastic modulator 220 and a frequency 2f that is twice the modulation frequency f of the photoelastic modulator 220. In particular, the noise may be generated by plasma emission inside the chamber where the measurement target 410 is arranged.

Figure 8:
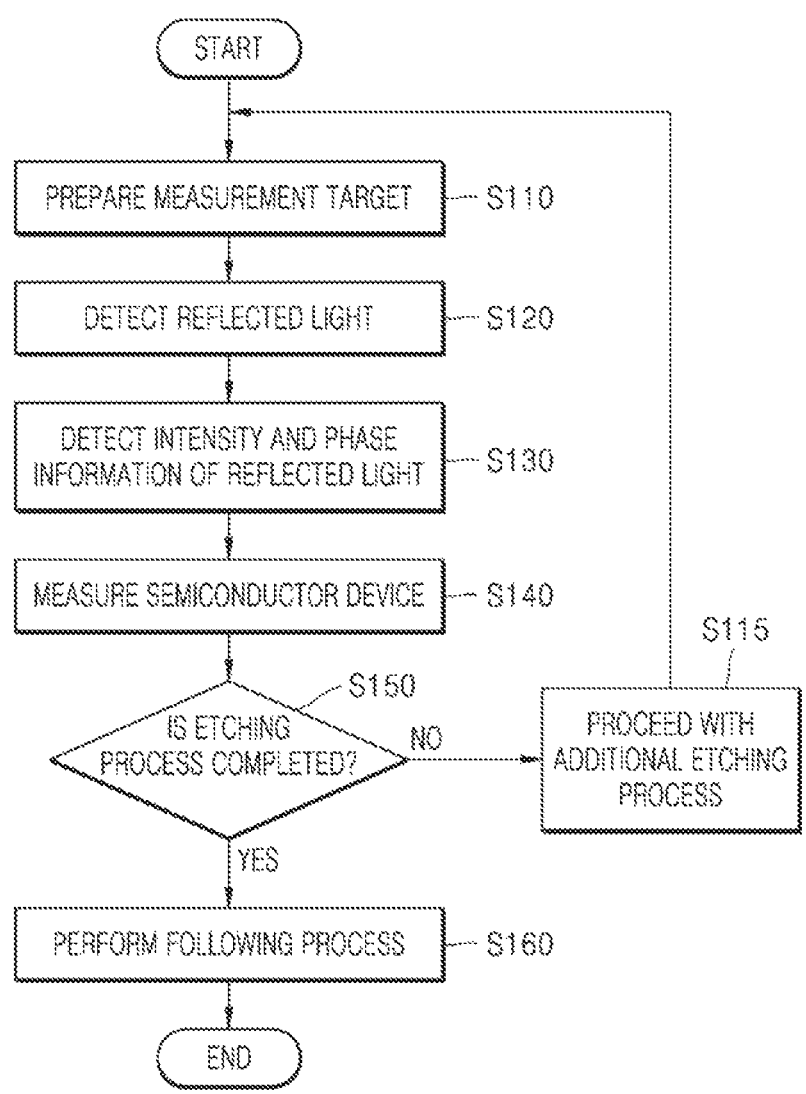
FIG. 8 is a flowchart illustrating a method of fabricating a semiconductor device according to an example embodiment.

FIG. 8 is a flowchart illustrating a method of fabricating a semiconductor device according to an example embodiment.

The example embodiments are described with reference to FIG. 1, and any redundant description is briefly given or omitted.

First, the measurement target 410 may be prepared (S110). The operation of preparing the measurement target 410 (S110) is described in more detail with reference to FIG. 9.

Reflected light may be detected by using the polarization measuring device 10 of FIG. 1 (S120). For example, by making polarized incident light be incident on the polarization measuring device 10, reflected light reflected from the measurement target 410 may be detected. The operation of detecting the reflected light (S120) has been described with reference to FIG. 7.

Next, information of the reflected light may be obtained based on the reflected light (S130). For example, as for the information of the reflected light, as described above, the reflectivity information, for example, the psi and delta, may be calculated by calculating $C_n$, $C_k$ and $CR_{nk}$.

Then, based on the reflectivity information, the measurement target 410 may be measured (S140). Here, the measuring may include analyzing and identifying various properties of the measurement target 410. For example, based on the reflectivity information, various properties of the measurement target 410, such as overlay errors, pattern sizes, pattern thicknesses, pattern uniformities, etc. may be identified and analyzed.

Then, whether the SR process is completed may be checked (S150). When the SR process is insufficiently performed, the SR process may be performed additionally (S115). When the SR process is completed, a following process may proceed (S160). The following process may include, for example, a process of forming a source and/or a drain at the plurality of etched thin film layers.

Figure 9:
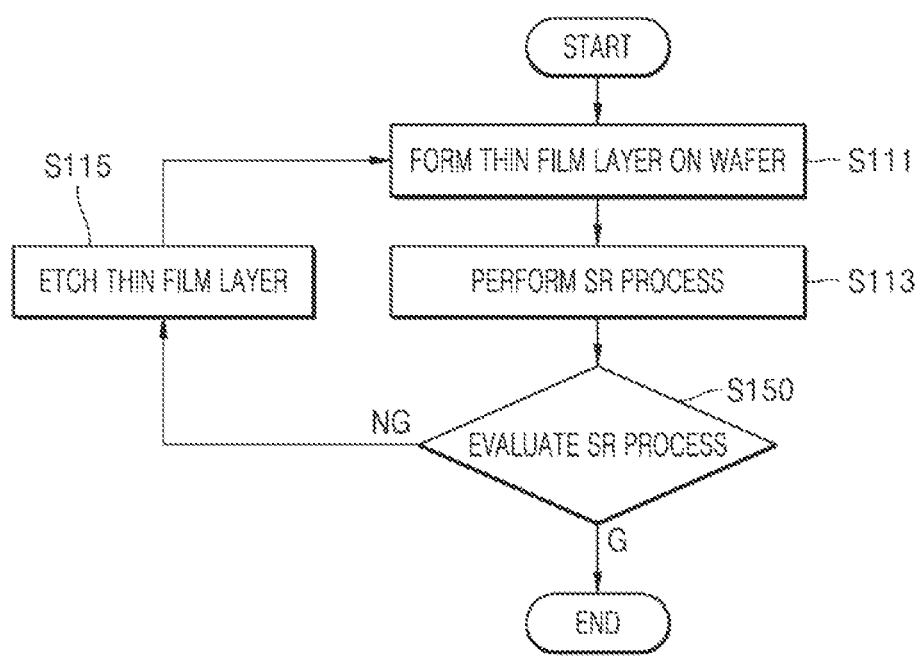
FIG. 9 is a flowchart illustrating a method of fabricating a semiconductor device according to an example embodiment.

FIG. 9 is a flowchart illustrating a method of fabricating a semiconductor device according to an example embodiment.

The process of fabricating a semiconductor device, performed in FIG. 9, may include, for example, a process of stacking a plurality of Si/SiGe thin film layers and the SR process.

With reference to FIGS. 1, 8 and 9, as described above, a plurality of Si/SiGe thin film layers may be sequentially formed on a wafer (S111).

Then, the SR process may be performed (S113). During the SR process, the plurality of Si/SiGe thin film layers may be partially etched.

Subsequently, the SR process evaluation may be performed (S150). The SR process evaluation may be performed by the polarization measuring device 10 of FIG. 1, and may substantially be the same as the inspection method described with reference to FIG. 8. The SR process evaluation may include inspection of etch depth of the Si/SiGe thin film layers (i.e., depth of an upper surface of an exposed wafer). A formation depth of a source/drain may be determined afterwards according to the etch depth of the Si/SiGe thin film layers.

When the SR process is evaluated as good in S150 (G), the etching of the plurality of Si/SiGe thin film layers is stopped, and the following process (S160) may be performed on the measurement target 410. For example, a source and/or a drain may be formed at the etched portion.

When the SR process is evaluated as faulty in S150 (NG), for example, when the plurality of Si/SiGe thin film layers are insufficiently etched, the plurality of Si/SiGe thin film layers may be further etched (S115).

While example embodiments have been particularly shown and described with reference to the drawings, it will be understood that various changes in form and details may be made therein without departing from the spirit and scope of the following claims and their equivalents.

What is claimed is:

1. A polarization measuring device comprising:
a stage on which a measurement target is provided;
a light source assembly configured to emit incident light;
a first polarimeter configured to polarize the incident light;
a second polarimeter configured to polarize reflected light reflected from the measurement target that is irradiated by the incident light;
a filter assembly configured to remove noise from the reflected light; and
a detector configured to receive the reflected light and measure an intensity of the reflected light and a phase of the reflected light,
wherein the detector is further configured to acquire a phase difference of frequencies of the reflected light,
wherein each of a polarization axis of the first polarimeter and a polarization axis of the second polarimeter changes based on the measurement target, and
wherein the detector is further configure to acquire differential values of a ratio of amplitudes of frequencies of the reflected light and the phase difference of frequencies of the reflected light in relation to time.

2. The polarization measuring device of claim 1, wherein the first polarimeter comprises a photoelastic modulator configured to change a phase of the incident light.

3. The polarization measuring device of claim 2, wherein the first polarimeter is further configured to separate the incident light into a plurality of beams having different phases.

4. The polarization measuring device of claim 1, wherein the first polarimeter is further configured to polarize the incident light into S-polarized light and P-polarized light.

5. The polarization measuring device of claim 1, wherein the filter assembly is configured to selectively transmit the reflected light having a wavelength between 350 nm to 450 nm.

6. The polarization measuring device of claim 1, wherein the light source assembly comprises a half-wave plate.

7. The polarization measuring device of claim 1, wherein the filter assembly comprises at least one of a band pass filter, a monochromator, and a spectrometer.

8. The polarization measuring device of claim 1, wherein a range of wavelength of the incident light is 200 nm to 800 nm.

9. The polarization measuring device of claim 1, wherein the incident light is incident on the measurement target perpendicular to the measurement target.

10. A polarization measuring device comprising:
a stage on which a measurement target is provided;
a light source assembly configured to emit incident light;
a first polarimeter configured to polarize the incident light;
a second polarimeter configured to polarize reflected light reflected from the measurement target that is irradiated by the incident light;
a filter assembly configured to remove noise from the reflected light; and
a detector configured to receive the reflected light and measure an intensity of the reflected light and a phase of the reflected light,
wherein the first polarimeter comprises a photoelastic modulator configured to change a phase of the incident light,
wherein the filter assembly comprises a lock-in amplifier configured to selectively acquire a signal of reflected light of a certain frequency,
wherein the detector is further configured to acquire a phase difference of frequencies of the reflected light,
wherein each of a polarization axis of the first polarimeter and a polarization axis of the second polarimeter changes based on the measurement target, and
wherein the detector is further configured to acquire differential values of a ratio of amplitudes of frequencies of the reflected light and the phase difference of frequencies of the reflected light in relation to time.

11. The polarization measuring device of claim 10, wherein the lock-in amplifier is further configured to acquire a signal of a modulation frequency f of the photoelastic modulator and a signal of a frequency 2f that is twice the modulation frequency f of the photoelastic modulator.

12. The polarization measuring device of claim 11, wherein the modulation frequency f ranges from 40 kHz to 60 kHz.

13. The polarization measuring device of claim 10, wherein the light source assembly comprises an xenon (Xe) lamp, and
   wherein the first polarimeter comprises a wire-grid polarizer or a Glan-Thompson prism.

14. The polarization measuring device of claim 10, further comprising a beam splitter configured to ramify the reflected light such that at least a portion of the reflected light is incident on the second polarimeter.

15. The polarization measuring device of claim 10, wherein the filter assembly is further configured to selectively transmit the reflected light having a wavelength between 350 nm to 450 nm.

16. The polarization measuring device of claim 10, wherein each of a polarization axis of the first polarimeter and a polarization axis the second polarimeter changes based on the measurement target.

17. The polarization measuring device of claim 10, wherein the filter assembly comprises at least one of a band pass filter, a monochromator, and a spectrometer.

18. The polarization measuring device of claim 10, wherein the incident light is incident on the measurement target perpendicular to the measurement target.

19. A method of fabricating a semiconductor device, the method comprising:
   linearly polarizing incident light on a measurement target;
   polarizing reflected light by reflecting light from the measurement target;
   filtering the reflected light that is polarized; and
   detecting the reflected light by receiving the reflected light,
   wherein the incident light includes first incident light and second incident light, a phase of the first incident light being different from a phase of the second incident light,
   wherein the filtering of the reflected light comprises selectively filtering a signal of a modulation frequency f of a photoelastic modulator and a signal of a frequency 2f, which is twice the modulation frequency f of the photoelastic modulator,
   wherein the detecting of the reflected light comprises receiving reflectivity information of the reflected light,
   wherein the detecting comprises acquiring a phase difference of frequencies of the reflected light,
   wherein each of a polarization axis of the linearly polarized light and a polarization axis of reflected light that is polarized changes based on the measurement target, and
   wherein the detecting comprises acquiring differential values of a ratio of amplitudes of frequencies of the reflected light and the phase difference of frequencies of the reflected light in relation to time.

* * * * *